United States Patent [19]

Natsui et al.

[11] Patent Number: 4,719,599
[45] Date of Patent: Jan. 12, 1988

[54] PROGRAMMABLE READ-ONLY MEMORY DEVICE PROVIDED WITH TEST CELLS

[75] Inventors: Yoshinobu Natsui; Hiroshi Mayumi, both of Tokyo, Japan

[73] Assignee: NEC Corporation, Tokyo, Japan

[21] Appl. No.: 666,515

[22] Filed: Oct. 30, 1984

[30] Foreign Application Priority Data

Oct. 31, 1983 [JP] Japan .................. 58-203975

[51] Int. Cl.⁴ .................. G11C 29/00; G11C 7/00
[52] U.S. Cl. .................. 365/201; 371/21; 365/105; 365/96
[58] Field of Search ............ 365/201, 180, 175, 104, 365/105, 103, 96; 371/21

[56] References Cited

U.S. PATENT DOCUMENTS 4,320,507 3/1982 Fukushima et al. .................. 371/21
4,347,584 8/1982 Fukushima et al. .................. 365/104

FOREIGN PATENT DOCUMENTS 0059630 9/1982 European Pat. Off. ............ 365/104
0052256 4/1980 Japan .................. 365/104

*Primary Examiner*—Stuart N. Hecker
*Assistant Examiner*—Glenn A. Gossage
*Attorney, Agent, or Firm*—Sughrue, Mion, Zinn, Macpeak and Seas

[57] ABSTRACT

A programmable read-only memory device of a junction destruction type is provided with a test circuit for the purpose of detecting a parasitic thyristor effect which may occur in the data programming operation by the user. The test circuit includes first and second additional row lines, a first diode connected between the first additional row line and one column line, a second diode connected between the second additional row line and another column line adjacent to the one column line, and a transistor of a base-open type connected between the second additional row line and the one column line.

9 Claims, 16 Drawing Figures

(a)

(b)

(c)

(a)

(b)

(c)

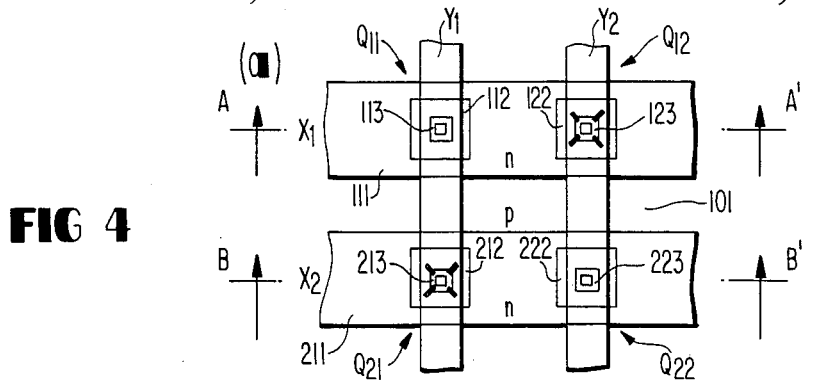
FIG 4
FIG 5
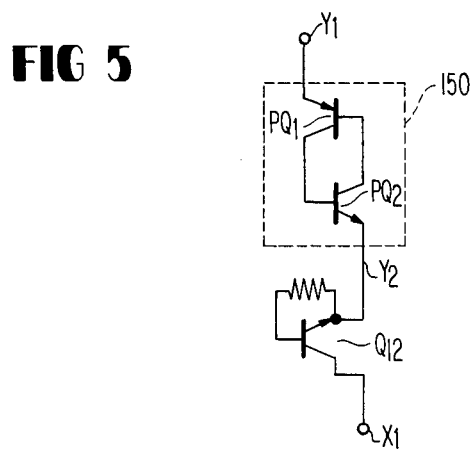

PROGRAMMABLE READ-ONLY MEMORY DEVICE PROVIDED WITH TEST CELLS

BACKGROUND OF THE INVENTION

The present invention relates to a read-only memory device, the content of which can be programmed electrically, that is, a programmable read-only memory device (hereinafter simply called as a "P-ROM"). More particularly, the present invention relates to a test circuit for checking whether or not programming data into a P-ROM can be conducted without failure.

Recently, P-ROMs have been gained an extremely wide range of applications in the field of data processing and control because of their advantage in that a user can freely program the data thereinto.

So-called "junction destruction type" and "fuse type" P-ROM's are well-known as bipolar P-ROM's. The junction destruction type P-ROM includes memory cells arrayed in a matrix form and each consisting of one bipolar transistor of a base-open type, which has a collector and an emitter connected to one row line and one column line, respectively. Programming data in a P-ROM of this type is performed by supplying a considerably large programming current to the selected memory cell to destroy, i.e., short-circuit the base-emitter junction of the cell transistor. As a result, the transistor of the programmed memory cell operates merely as a diode to allow a reading-out current to flow from the column line to the row line in data read-out operation. On the other hand, the base-emitter junction of the transistor in the non-programmed memory cells prevents the current from flowing from the column to row lines.

In the fuse type P-ROM, each memory cell consists of a fuse and a diode connected in series between each column line and each row line. Data programming in this type is carried out by supplying a programming current to the selected memory cell to melt the fuse. In the read-out operation, the reading-out current does not flow from the selected column line to the selected row line, when the programmed memory cell is disposed at the intersection of the selected column and row lines. If the selected memory cell is not programmed, the reading-out current flows between the column and row lines. The fuse type P-ROM is, however, disadvantageous in that the melted fuse is scattered over the surface of the P-ROM chip to adversely affect the electrical performances of the P-ROM. The junction destruction type P-ROM is preferable in this respect.

It will be apparent that a P-ROM without any programmed cell should be offered to users. Accordingly, any defectiveness in the P-ROM does not appear until the programming is done by the user, who finds that the data program cannot be correctly performed. The malfunction of peripheral circuits or the defect in the memory cells themselves may make the data program impossible. However, even where the peripheral circuits and the memory cells have no defect, there occurs a phenomenon that the data program cannot be correctly carried out to the P-ROM of the junction destruction type. This phenomenon becomes remarkable as the memory capacity of the P-ROM increases. The inventors of the present invention have investigated the cause of the phenomenon, and discovered that the cause is a parasitic thyristor effect based on a particular geometrical relationship among the programmed and unprogrammed cells in the memory cell array. The parasitic thyristor effect occurs when the programmed and unprogrammed cells determined by the user take the particular geometrical relationship.

SUMMARY OF THE INVENTION

It is, therefore, an object of the present invention to provide a programmable read-only memory device in which the occurrence of a parasitic thyristor effect is detectable.

Another object of the present invention is to provide a programmable read-only memory device provided with a test circuit for testing whether a parasitic tyristor effect occurs or not.

A programmable read-only memory device according to the present invention comprises a plurality of row and column lines, a plurality of memory cells disposed at the respective intersections of the row and column lines and each including a base opened transistor having a collector connected to each row line and an emitter connected to each column line, first means responsive to a first set of address signals for selecting one of the row lines, second means responsive to a second set of address signals for selecting one of the column lines, and a test circuit for testing an occurrence of a parasitic thyristor effect, the test circuit including first and second additional row lines, a first diode connected between the first additional row line and a first one of the column lines, a second diode connected between the second additional row line and a second one of the column lines adjacent to the first one of the column lines, an additional base-opened transistor having a collector connected to the second additional row line and an emitter connected to the first one of the column lines, and third means for selecting at least the first additional row line.

The P-ROM according to the present invention is thus provided with the test circuit for detecting the occurrence of a parasitic thyristor effect. According to the inventors' finding, the parasitic thyristor effect occurs in four memory cells which are disposed at the respective intersections of the adjacent two row lines and the adjacent two column lines, when first and second memory cells positioned on one diagonal line are programmed and third and fourth memory cells positioned on the other diagonal line are not yet programmed. The first and second transistors respectively constituting the first and second memory cells then operate merely as diodes. When the third memory cell is to be programmed, the row and column lines between which the third memory cell is coupled are selected to supply a programming current to the third memory cell through the selected column line. It should be noted that the diodes of the first and second memory cells and the fourth transistor constituting the fourth memory cell are coupled in series between the selected row and column lines. The collectors of the second and fourth transistors are common to form the column line to which the second and fourth memory cells are connected, and hence the device structure of the part including the second and fourth transistors is equivalent to a P-N-P-N thyristor structure. In other words, a parasitic lateral transistor formed of the base of the second transistor with the emitter being shortcircuited to the base by programming, the common collector and the base of the fourth transistor and a vertical transistor formed by the common collector, the base and the emitter of the fourth transistor consitutes the parasitic thyristor. If the product of current gains of these lateral and vertical transistors is more than 1, the parasitic thyristor is made conductive by the programming current. As a result, the programming current supplied to the selected column line flows, not through the selected third transistor to be programmed, but through the first, second and fourth transistors to the selected row line. Programming the third memory cell is thereby impossible.

With the test circuit according to the present invention, the first additional row line is selected by the third means and the second one of the column lines is selected by the second means. A current is supplied to the second one of the column lines. Since the first additional row line is disconnected from the second one of the column lines, the current does not flow to the first additional row line if the thyristor effect does not occur. However, if the parasitic thyristor formed by the second diode and the additional transistor is made conductive, the current will flow from the second column line to the first additional row line through the first and second diodes and the additional transistor. This means that the parasitic thyristor effect may also occur in the memory cell array upon the data programming by the user. Thus, the defectiveness in the P-ROM caused by the parasitic thyristor effect can be detected prior to the shipment of P-ROMs.

Preferably, the first and second diodes are formed of the base-collector junction of a transistor. Further, the distance between the anode region of the second diode and the base region of the additional transistor preferable is shorter than that between the base regions of the adjacent two memory cells connected to the same row lines in order to increase the sensitivity of detecting the parasitic thyristor effect by the test circuit.

BRIEF DESCRIPTION OF THE DRAWINGS

The above and other objects, features and advantages of the present invention will be more apparent from the following description taken in conjunction with the accompanying drawings, in which

FIG. 4A is a plan view of a part including the transistors $G_{11}$, $Q_{12}$, $Q_{21}$ and $Q_{22}$ shown in FIG. 3, and FIGS. 4B and 4C are cross-sectional views along the lines A—A' and B—B' of FIG. 4A;

FIG. 5 is a circuit diagram showing a parasitic thyristor,

DETAILED DESCRIPTION OF THE INVENTION

Figure 1:
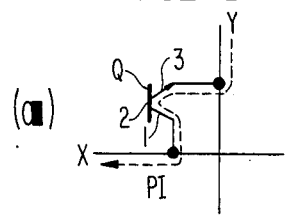
FIGS. 1A, 1B and 1C are an equivalent circuit, a plan view and a cross-sectional view of one memory cell in a P-ROM of a junction destruction type, respectively.
Figure 1:
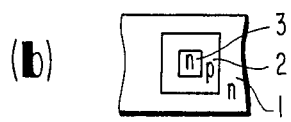
Figure 1:
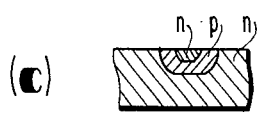
Figure 2:
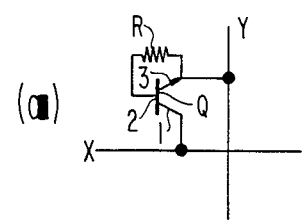
FIGS. 2A, 2B and 2C are an equivalent circuit, a plan view and a cross-sectional view of a programmed memory cell, respectively.
Figure 2:
Figure 2:

With reference to FIGS. 1 to 5, the defectiveness in the data programming caused by a parasitic thyristor effect made clear by the inventors will be described in detail in order to facilitate the understanding of the features and advantages of the present invention. FIG. 1 shows one memory cell in a P-ROM of the junction destruction type, which consists of one NPN transistor Q. The transistor Q has a collector region 1 of an N-type, a base region 2 of a P-type and an emitter region 3 of an N-type, as shown in FIGS. 1B and 1C. The collector 1 is connected to one row line X and the emitter 3 is connected to one column line Y, but the base 2 is in an open-state, as shown in FIG. 1A. The transistor Q is programmed by supplying a programming current PI from the column line Y to the row line X through the transistor Q. The base-emitter junction of the transistor Q is subjected to be destroyed, i.e., to be short-circuited by the programming current PI. On the other hand, the base-collector junction is not destroyed, since the programming current PI flows thereinto in a forward-bias direction. As a result, the programmed transistor Q operates as a diode formed of the base-collector junction.

The equivalent circuit, a plan view and a cross-sectional view of the programmed memory cell are shown in FIGS. 2A, 2B and 2C, respectively. In FIG. 2A, a resistor R connected between the emitter and base of the transistor Q represents the short circuit of the base-emitter junction. Further, fat lines written across the base-emitter junction in FIGS. 2B and 2C also indicate the short circuit thereof.

Figure 3:
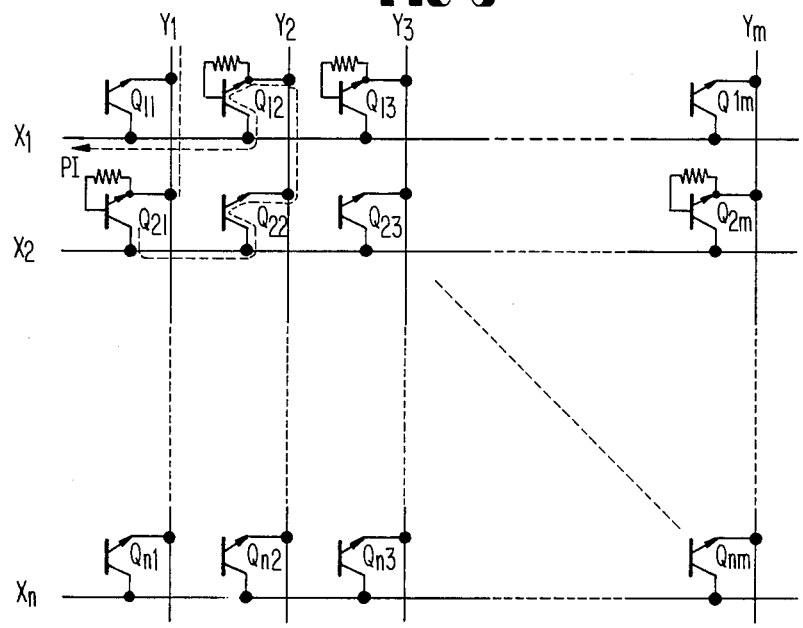
FIG. 3 is an equivalent circuit of a memory cell array in which some of memory cells are programmed.

Referring to FIG. 3, there is shown a memory cell array 10 in the P-ROM of the junction destruction type. The memory cell array 10 includes a plurality of row and column lines ($X_l$ to $X_n$, and $Y_l$ to $Y_m$) and a plurality of memory cells ($Q_{11}$ to $Q_{nm}$) disposed at the respective intersections of the row and column lines. As mentioned in FIG. 2, the transistors $Q_{12}$, $Q_{13}$, $Q_{21}$ and $Q_{2m}$ are programmed by the user. Under such a condition, when the transistor $Q_{11}$ is thereafter programmed by the user, the programming current PI often flows from the column line $Y_1$ to the row line $X_1$ through the transistors $Q_{21}$, $Q_{22}$ and $Q_{12}$, not through the transistor $Q_{11}$, as shown in FIG. 3. This is caused by a parasitic thyristor effect formed of the transistors $Q_{21}$ and $Q_{22}$.

More specifically, the collectors of the transistors $Q_{11}$ and $Q_{12}$ (and $Q_{13}$ to $Q_{1m}$) are connected in common to the row line $X_1$, and therefore, an N-type region 111 serves as collector regions of the transistors $Q_{11}$ and $Q_{12}$ and as the row line $X_1$, as shown in FIG. 4. Similarly, an N-type region 211 serves as collector regions of the transistors $Q_{21}$ and $Q_{22}$ (and $Q_{23}$ to $Q_{2m}$) and as the row line $X_2$. The regions 111 and 211 are formed on a P-type silicon substrate 100 and are electrically isolated from each other by an isolation region 101 of a P-type. Base regions 112 and 122 of the transistors $Q_{11}$ and $Q_{12}$ are formed in the region 111 at a distance, and base regions 212 and 222 of the transistors $Q_{21}$ and $Q_{22}$ are formed in the region 211 at a distance. Emitter regions 113 and 213 of the transistors $Q_{11}$ and $Q_{21}$ are connected to the column line $Y_1$ made of a metal such as aluminum through contact holes provided in an insulating film 102, and emitter regions 123 and 223 of the transistors $Q_{12}$ and $Q_{22}$ are connected to the column line $Y_2$ through contact holes. The column line $Y_2$ is also made of a metal. Since the transistors $Q_{12}$ and $Q_{21}$ are already programmed, the base regions 122 and 212 are connected to the column lines $Y_2$ and $Y_1$ without a P-N junction, respectively. Therefore, as apparent from FIGS. 4B and 4C, a thyristor constituted by four regions 213, 211, 222 and 223 is formed between the column lines $Y_1$ and $Y_2$, and the column line $Y_2$ is coupled to the row line $X_1$ through the base-collector junction of the transistor $Q_{12}$. The equivalent circuit of this thyristor is shown in FIG. 5.

In FIG. 5, a transistor $PQ_1$ is a parasitic lateral PNP transistor formed of the P-type region 212, N-type region 211 and P-type region 222, and a transistor $PQ_2$ is a vertical NPN transistor formed of the N-type region 211, P-type region 222 and N-type region 223 (which is equivalent to the transistor $Q_{22}$) If the product of current gains of the transistors $PQ_1$ and $PQ_2$ is more than 1, the parasitic thyristor 150 constituted by the transistors $PQ_1$ and $PQ_2$ is made conductive by a programming power to be used for programming the transistor $Q_1$. As a result, the programming current fed from the column line $Y_1$ flows through the parasitic thyristor 150 and the transistor $Q_{12}$ into the row line $X_1$. In other words, the programming of the transistor $Q_{12}$ is not carried out.

The product of current gains of the transistors $PQ_1$ and $PQ_2$ may be designed to be less than 1 by lengthening the distance between the base regions of the adjacent two cell transistors and/or doping impurities serving as a life-time killer into the respective N-type regions operating as the row lines. However, the distance between the base regions as well as the doping quantity of the impurities are deviated from the designed value due to the variation in the manufacturing conditions of the device. In addition, the distance between the base regions should be made short in order to obtain a large memory capacity. This means that the current gain of the parasitic lateral transistor $PQ_1$ is increased. Accordingly, it is not guaranteed that the parasitic thyristor effect is prevented. The parasitic thyristor effect does not appear until the user carries out the data programming.

Figure 6:
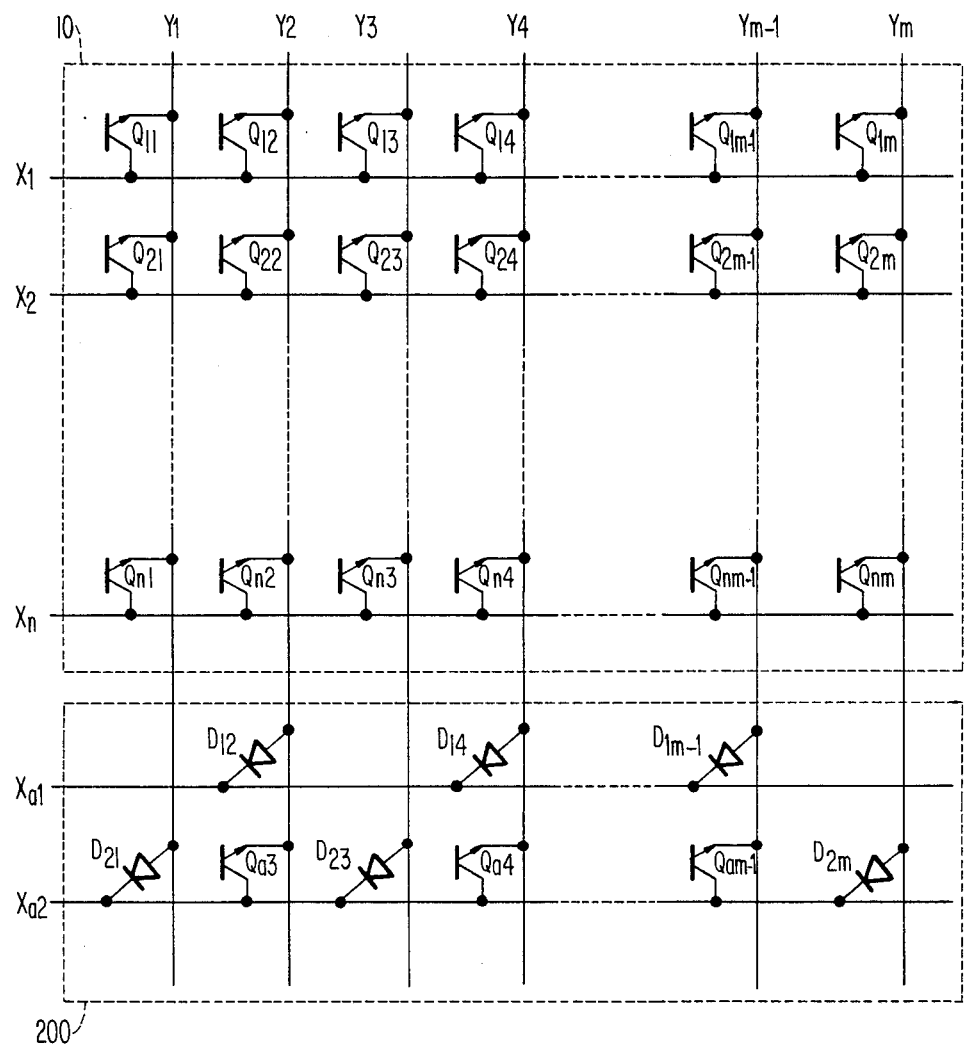
FIG. 6 is a circuit diagram representing a memory cell array and a test cell array in a P-ROM according to one embodiment of the present invention.

In order to previously remove P-ROMs in which the parasitic thyristor effect may occur, a test cell array 200 is provided in a P-ROM according to an embodiment of the present invention, as shown in FIG. 6. The test cell array 200 is disposed separately from the memory cell array 10 for the user's use, and includes two additional row lines $X_{a1}$ and $X_{a2}$, while column lines used therein are common to the column lines $Y_1$-$Y_m$ of the memory cell array 10. The test cell array further includes a plurality of transistors of a base-open type and diodes preferably formed of the base-collector junction of a transistor, which are selectively disposed at the intersections of the additional row lines $X_{a1}$ and $X_{a2}$ and the column lines $Y_1$ through $Y_m$ to form a pattern configuration in which a parasitic thyristor effect may occur. More specifically, the diodes $D_{12}$ to $D_{1m-1}$ are disposed alternately at the respective intersections of the additional row line $X_{a1}$ and the column lines $Y_1$ to $Y_m$. In this embodiment, the diodes $D_{12}$ to $D_{1m-1}$ are disposed at the intersections of the row line $X_{a1}$ and the even-numbered column lines. Disposed at the intersections of the row line $X_{a2}$ and the even-numbered column lines are transistors $Q_{a2}$ to $Q_{am-1}$ of a base-open type, and the diodes $D_{21}$ to $D_{2m}$ are disposed at the intersections of the row line $X_{a2}$ and the odd-numbered column lines. The intersections of the row line $X_{a1}$ and the odd-numbered column lines are vacant and the row line $X_{a1}$ is disconnected from the odd-numbered column lines in order to improve the sensitivity of detection of the parasitic thyristor effect.

Figure 7:
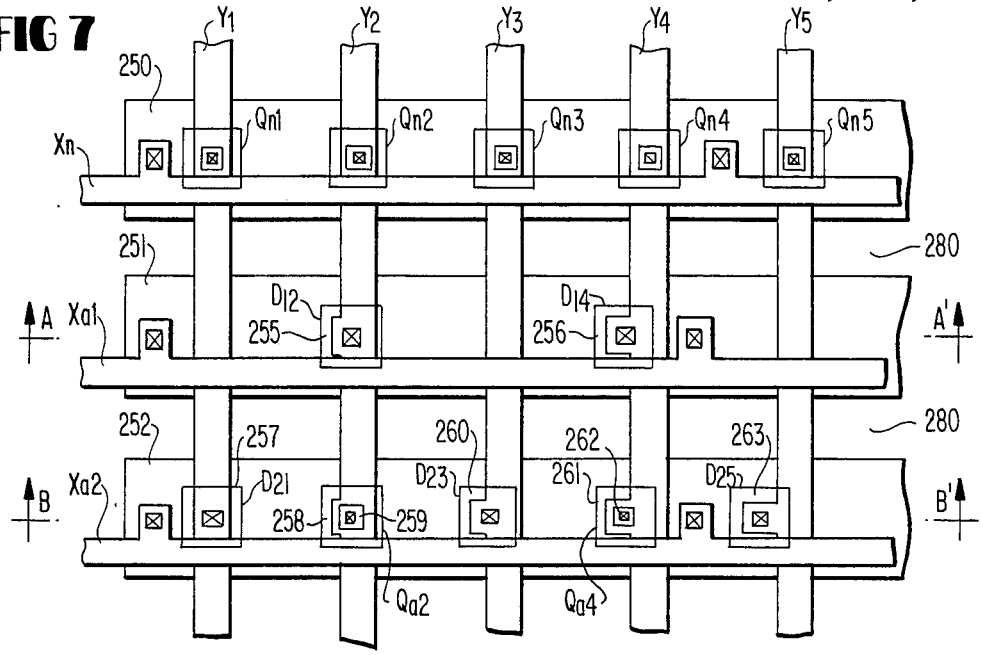
FIG. 7 is a plan view of a part including the test cell array and a portion of the memory cell array shown in FIG. 6.
Figure 8:
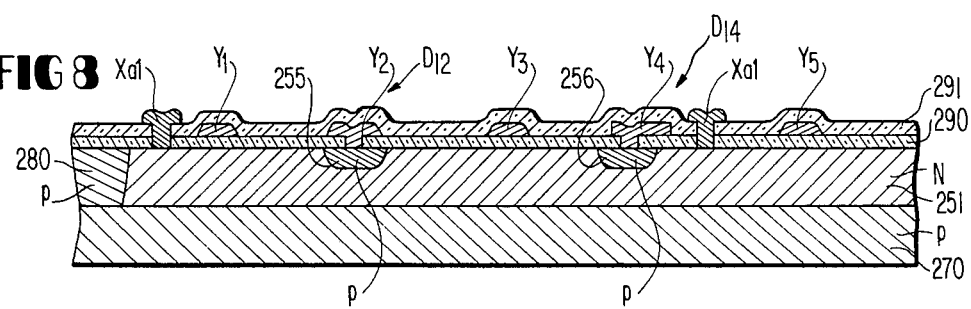
FIG. 8 is a cross-sectional view along the line A—A' of FIG. 7.
Figure 9:
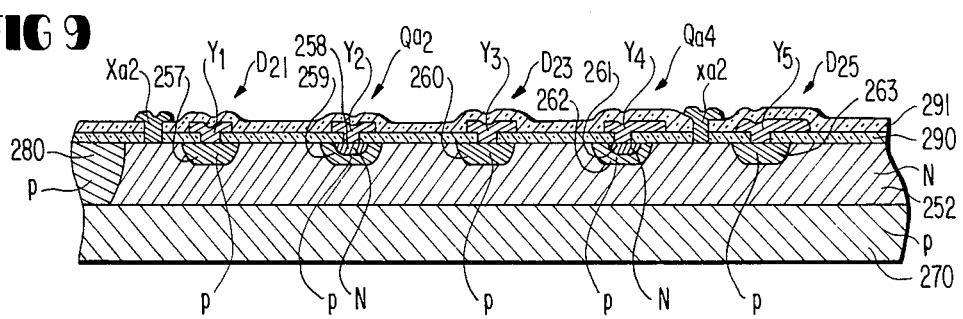
FIG. 9 is a cross-sectional view along the line B—B' of FIG. 7.

FIG. 7 shows a partial plan view of the device structure in the test cell array 200 and a portion of the memory cell array 10. The cross-sectional views along the lines A—A' and B—B' of FIG. 7 is shown in FIGS. 8 and 9, respectively. An N-type region 250 serves as the collector regions of the transistor $Q_{n1}$ to $Q_{nm}$ and as the row line $X_n$, since the collector of them are connected in common to the row line $X_n$. The sheet resistance of the region 250 is relatively high, and hence a metal row line $X_n$ is also provided and has a contact with the region 250 through contact holes provided in insulating films 290 and 291 covering the region 250. Each of the transistors $Q_{nl}$ to $Q_{nm}$ has a P-type base region and an N-type emitter region, as mentioned in FIG. 4. The emitter regions of the transistors $Q_{nl}$ to $Q_{nm}$ are connected to the column lines $Y_1$ to $Y_m$ made of a metal, respectively. An N-type region 251 serves as the cathode regions of the diodes $D_{12}$ to $D_{1m-1}$ and as the first additional row line $X_{a1}$. A metal row line $X_{a2}$ is further provided and has a contact with the region 251 through contact holes provided in the insulating films 290 and 291 in order to reduce the resistance of the region 251. Each of the diodes $D_{12}$ to $D_{1m-1}$ has an anode region of a P-type formed in the region 251. The anode regions of the diodes $D_{12}$ to $D_{1m-1}$ are connected to the even-numbered column lines $Y_2, Y_4, \ldots$, as mentioned above. In the drawings, only two anode regions 255 and 256 of the diodes $D_{12}$ and $D_{14}$ are shown, and they are connected to the column lines $Y_2$ and $Y_4$, respectively. Since the cathodes of the diodes $D_{21}$ to $D_{2m}$ and the collectors of the transistor $Q_{a2}$ to $Q_{am-1}$ are connected in common to the second additional row line $X_{a2}$, an N-type region 252 is provided to serve as the cathode and collector regions and as the row line $X_{a2}$. A metal row line $X_{a2}$ is also provided to make contact with the region 252. P-type anode regions 257, 260, 263, ... of the diodes $D_{21}, D_{23}, D_{25}, \ldots$ are formed in the region 252 and connected to the odd-numbered column lines $Y_1, Y_3, Y_5, \ldots$. Each of the transistors $Q_{a2}, Q_{a4}, \ldots$ has a P-type base region (259, 262, ...) formed in the region 252 and an N-type emitter region (258, 261, ...). The emitter regions of the transistors $Q_{a2}$ to $Q_{am-1}$ are connected to the even-numbered column lines $Y_2, Y_4, \ldots$. Each of the anode regions 255, 256, 257, 260, 263 has the same junction depth as each of the base regions of the transistors $Q_{nl}$ to $Q_{nm}$ and $Q_{a2}$ to $Q_{am-1}$, and thus made of the base-collector junction of a transistor. The respective cross-over points of the additional metal row lines $X_{a1}$ and $X_{a2}$ and the column lines $Y_1$ to $Y_m$ are isolated from each other by the insulating film 291. The films 291 and 292 are made of a silicon-oxide. The regions 250 to 252 are formed on a P-type silicon substrate 270 and electrically isulated from one another by an isolation region 280 of a P-type.

As apparent from FIG. 9, a pair comprising a diode and transistor which are adjacent to each other, i.e., $D_{21}$ and $Q_{a2}$, $Q_{a2}$ and $D_{23}$, $D_{23}$ and $Q_{a4}$, etc., constitutes a parasitic thyristor composed of the anode region 257 of the diode $D_{21}$, the region 252, the base region 259 of the transistor $Q_{a2}$, and the emitter region 258 of the same, for example. Further, the column line $Y_2$ is coupled to the first additional row line $X_{a1}$ through the diode $D_{12}$. Accordingly, the equivalent circuit between the column line $Y_1$ and the additional row line $X_{a1}$ becomes substantially equal to that shown in FIG. 5.

In the test mode, the column line $Y_1$ and the first additional row line $X_{a1}$ are selected. Since the row line $X_{a1}$ is disconnected from the column line $Y_1$ as apparent from FIGS. 6 and 8, a current fed from the column line $Y_1$ ought not to flow into the first additional row line $X_{a1}$. However, if the parasitic thyristor constituted by the diode $D_{21}$ and the transistor $Q_{a2}$ is made conductive by the selection of the column and row line $Y_1$ and $X_{a2}$, the current fed from the column line $Y_1$ flows into the additional row line $X_{a2}$ through the diode $D_{21}$, $Q_{a2}$ and $D_{12}$. This means that as shown in FIG. 4, the programming into the transistor $Q_{11}$ is not performed due to the parasitic thyristor effect caused by the programmed transistors $Q_{21}$ and $Q_{12}$ and the unprogrammed transistor $Q_{22}$. Accordingly, the P-ROM having a defectiveness which may occur in the data programming due to the parasitic thyristor effect is removed prior to the shipment to the user.

Moreover, as apparent from FIG. 7, the distance between the anode region (257, 260, 263, ...) of the respective diode $D_{21}$ to $D_{2m}$ and the base region (259, 262, ...) of the respective transistor $Q_{a2}$ to $Q_{am-1}$ is designed to be shorter than that between the base regions of the adjacent two transistors in the memory cell array 10. In other words, the parasitic thyristor effect in the test cell array 200 occurs more easily, as compared with the occurrence of the parasitic thyristor effect in the memory cell array 10. Accordingly, the P-ROM having the above-mentioned defect can be removed certainly. It is favorable that the distance between the anode region and base region in the test cell array 200 is designed to be 0.7 to 0.9 times of that between the base regions in the memory cell array 10.

In a case where the column line $Y_3$ and the first additional row line $X_{a1}$ are selected, if at least one of two parasitic thyristors constituted by the transistor $Q_{a2}$ and the diodes $D_{23}$ and the transistor $Q_{a4}$ and the diode $D_{23}$ is made conductive, a current fed from the column line $Y_3$ flows into the first additional row line $X_{a1}$. Accordingly, the occurrence of the parasitic thyristor effect between the column lines $Y_2$ and $Y_3$ as well as between $Y_3$ and $Y_4$ is detected.

Figure 10:
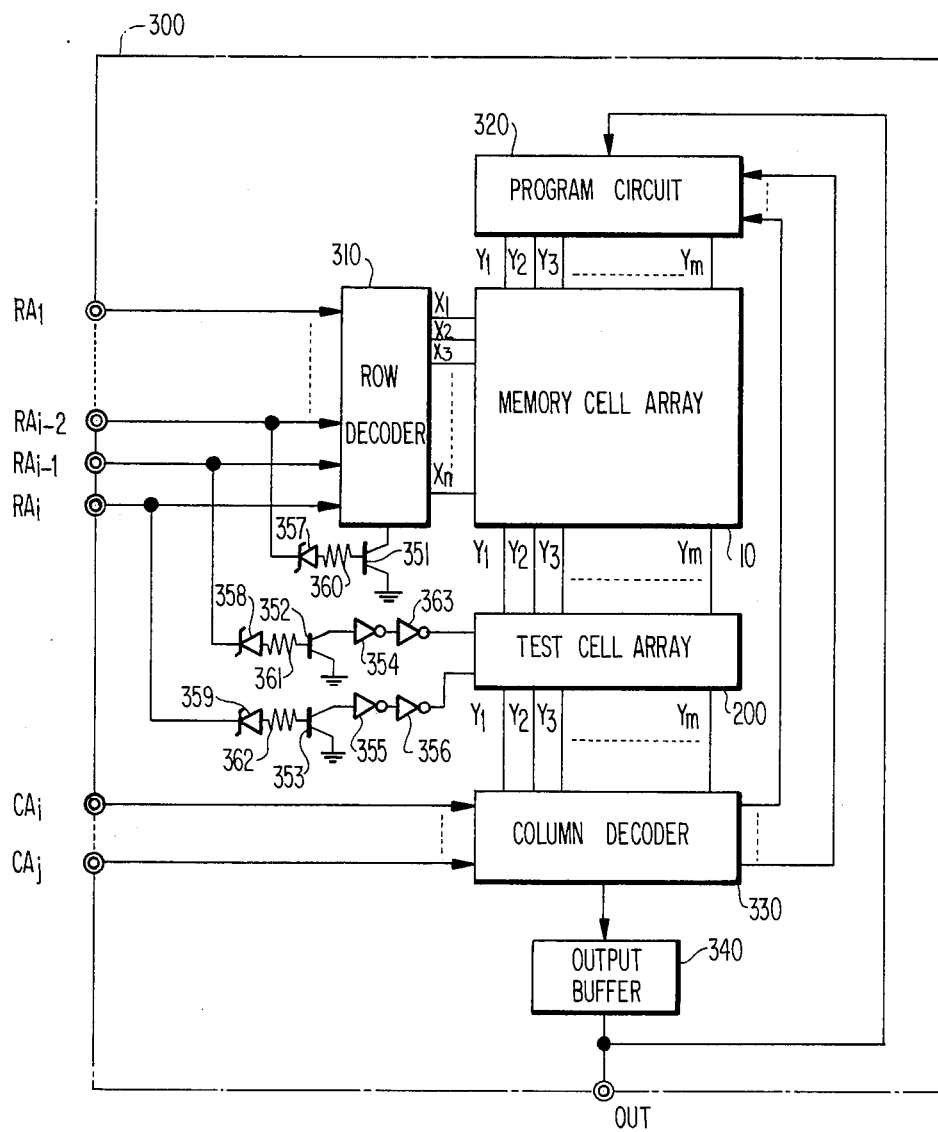
FIG. 10 is a block diagram of the P-ROM according to the present invention.

FIG. 10 shows a block diagram of a P-ROM according to the present invention. This P-ROM is formed as an integrated circuit device 300 which has row address signal input terminals $RA_l$ to $RA_i$, column address input terminals $CA_l$ to $CA_j$, and an output terminal OUT. Memory cell array 10 and test cell array 200 have the same construction as those shown in FIG. 6. A row decoder 310 responds to the row address signals supplied to the terminals $RA_l$ to $RA_i$ and selects one of the row lines $X_1$ to $X_n$. A column decoder 330 responds to column address signals supplied to the terminals $CA_0$ to $CA_j$ and selects one of the column lines $Y_1$ to $Y_m$. The column decoder 330 supplies an output buffer 340 with data appearing at the selected column line. The output buffer 340 thus supplies the data to the output terminal OUT. The column address signals are further supplied to a program circuit 320, which thereby selects one of the column lines $Y_1$ to $Y_m$ in order to supply the selected column line with a programming current supplied through the terminal OUT from the externally provided programming equipment (not shown).

In a test mode for testing whether the parasitic thyristor effect occurs or not in the test cell array 200, any one of the row lines $X_1$ to $X_n$ should not be selected. For this purpose, an NPN transistor 351 is coupled between the row decoder 310 and the ground potential, and its base is connected to row address terminal $RA_{i-2}$ through a resistor 360 and a Zener diode 357. The row address signal to be supplied to the row decoder 310 has a voltage amplitude of about 5 V. On the contrary, the Zener voltage of the Zener diode 357 is about 8 V, and hence the transistor 351 is in a nonconductive state upon the data read operation and the data programming operation. When the signal having a voltage level more than 8 V is applied to the terminal $RA_{i-2}$, the transistor 351 is made conductive to inactivate the row decoder 310. Also in the test mode, the first additional row line $X_{a1}$ should be selected. For this purpose, the additional row line $X_{a1}$ is connected through inverters 354 and 363 to the collector of a transistor 352 whose base is connected through a resistor 361 and a Zener diode 358 to the terminal $RA_{i-1}$. When the signal having a level more than 8 V is applied to the terminal $RA_{i-1}$, the transistor 352 is made conductive to select the first additional row line $X_{a1}$. In other words, the P-ROM is brought into the test mode by pulling up the potentials at the terminals $RA_{i-2}$ and $RA_{i-1}$ more than 8 V. When the P-ROM is in the test mode, the column decoder 330 and the output buffer 340 are inactivated to inhibit the data read-out operation. On the other hand, the program circuit 320 selects either one of the column lines $Y_1$ to $Y_m$ in response to the column address signals supplied to the terminals $CA_l$ to $CA_j$, and supplies the selected column line ($Y_1$, for example) with a testing current derived through the output terminal OUT from the externally provided test equipment (not shown). It is preferable that the testing current is selected to be smaller than the programming current. This is because the base-emitter junction of the memory cell is not destroyed even when the testing current flows therein erroneously. If the parasitic thyristor effect occurs in the test cell array 200 as described hereinbefore, the testing current flows into the ground terminal. Accordingly, the potential at the output terminal OUT is lowered. On the contrary, when the parasitic thyristor effect does not occur, the testing current is prevented from flowing into the ground terminal. The potential at the terminal OUT is thereby held at a high level. Thus, it is detected whether the parasitic thyristor effect occurs or not, by monitoring the potential at the output terminal OUT.

Since the second additional row line $X_{a2}$ is not selected in the test mode for testing the occurrence of the parasitic thyristor effect, the selection circuit composed of a transistor 353, a resistor 362, a Zener diode 359, and two inverters 355 and 356 may be omitted. However, if the second additional row line $X_{a2}$ is selected by this selection circuit, the testing current fed from the column line $Y_1$ flows into the ground potential to lower the potential at the terminal OUT. Accordindly, the test for the operation of the program circuit 320 can be attained.

As described above in detail, the present invention provides a P-ROM in which the defectiveness in the data programming operation caused by the parasitic thyristor effect is detected before data is programmed into the P-ROM.

It is apparent that the present invention is not limited to the above-mentioned embodiments, but may be modified and changed without departing from the scope and spirit of the present invention. For example, in FIG. 10, the memory cell array 10 and the test cell array 200 may be provided plurally to output a plurality of data simultaneously.

What is claimed is:

1. A memory device comprising a plurality of row and column lines, a plurality of memory cells disposed at the respective intersections of said row and column lines, first means responsive to a first set of address signals for selecting one of said row lines, second means responsive to a second set of address signals for selecting one of said column lines, and a test circuit including first and second additional row lines, a first diode disposed at the intersection of said first additional row line and a first one of said column lines, a second diode disposed at the intersection of said second additional row line and a second one of said column lines adjacent to said first one of said column lines, a first transistor disposed at the intersection of said second additional row line and said first one of said column lines, the first additional row line and said second one of said column lines being isolated from each other without any transistor or diode being disposed at an intersection thereof, and third means for selecting said first additional row line.

2. The memory device as claimed in claim 1, further comprising a first set of address input terminals supplied with said first set of address signals, said third means selecting said first additional row line in response to a signal supplied to one of said address input terminals.

3. The memory device as claimed in claim 1, further comprising fourth means for inactivating said first means when said first additional row line is selected.

4. The memory device as claimed in claim 1, wherein each of said memory cells includes a base-opened transistor having an emitter connected to an associated column line and a collector connected to an associated row line, and said first transistor is a base-opened transistor having an emitter connected to said first one of the column lines and a collector connected to said second additional row line.

5. The memory device as claimed in claim 4, wherein a distance between the base region of said first transistor and the anode region of said second diode is selected to be shorter than that between the base regions of the transistors of the memory cells connected to the same row lines and to adjacent column lines.

6. A programmable read-only memory device of a type in which each of a plurality of memory cells arranged in a matrix having a plurality of row and column lines includes a first transistor of the open-base type and selected ones of said memory cells are programmed by short-circuiting the base-emitter junctions of the transistors therein, comprising first and second additional row lines, a plurality of first diodes disposed at first intersections of said first additional row line and alternate ones of said column lines, a plurality of second diodes disposed at second intersections of said second additional row line and remaining ones of said column lines, a plurality of second transistors of a base-open type disposed at third intersections of said second additional row line and said alternate ones of said column lines, said first additional row line and remaining ones of said column lines being isolated from each other without any transistor or diode being disposed at respective intersections thereof, means for selecting said first additional row line in a test mode, and means for introducing in said test mode a current to a selected one of said remaining ones of said column lines.

7. The memory device as claimed in claim 6, further comprising at least one data output terminal, said current being supplied externally through said data output terminal in said test mode.

8. A semiconductor memory comprising a memory array including a plurality of row and column lines and a plurality of memory cells disposed at intersections of said row and column lines, first and second additional row lines, a first diode connected between said first additional row line and one of said column lines, said first additional row line being isolated from another of said column lines adjacent to said one column line without any transistor or diode being connected therebetween, a second diode connected between said second additional row line and said another of said column lines, a transistor of the base-open type connected between said second additional row line and said one column line, and means for supplying testing current from said another of said column lines via said second diode, said transistor of the base-open type and said first diode to said first additional row line by means of a parasitic thyristor action induced by said second diode and said transistor of the base-open type, such that said semiconductor memory is judged to be defective when said testing current flows from said other column line to said first additional row line to said parasitic thyristor action and is detected to be good when said testing current does not flow into said first additional row line.

9. A method of testing a semiconductor memory having a memory cell array including a plurality of memory cell transistors disposed at intersections of respective pluralities of row and column lines, means responsive to a set of address signals for selecting one of said memory cells, an output terminal, means for reading out data stored in the selected memory cell to produce at said output terminal an output data signal responsive to said data, and a test cell array including first and second test row lines, a first diode connected between said first test row line and one of said column lines, a second diode connected between said second test row line and another of said column lines adjacent to said one column line and a transistor connected between said second test row line and said one column line, said first test row line being isolated from said other column line without any diode or transistor connected therebetween, said method comprising the steps of selecting said other column line, deactivating said selecting means and said reading out means, feeding a testing current from said output terminal to the selected other column line, monitoring a potential at said output terminal, said potential at said output terminal being changed to a low level when said testing current flows into said first test row line from said other column line via said second diode, said transistor and said first diode due to a parasitic thyristor action of said second diode and said transistor, said potential at said output terminal being held at a high level when said parasitic thyristor action does not occur, and estimating whether a parasitic thyristor action may occur in said memory cell array when said memory cell array is programmed.

* * * * *

UNITED STATES PATENT AND TRADEMARK OFFICE
CERTIFICATE OF CORRECTION

PATENT NO. : 4,719,599

DATED : January 12, 1988

INVENTOR(S) : NATSUI ET AL.

It is certified that error appears in the above-identified patent and that said Letters Patent is hereby corrected as shown below:

COLUMN 6, LINE 56 Delete "isulated" and insert --isolated--

Signed and Sealed this

Seventh Day of February, 1989

Attest:

DONALD J. QUIGG

Attesting Officer

Commissioner of Patents and Trademarks